(12) United States Patent
Miles et al.

(10) Patent No.: US 6,932,957 B2
(45) Date of Patent: Aug. 23, 2005

(54) METHOD AND APPARATUS FOR INCREASING BULK CONDUCTIVITY OF A FERROELECTRIC MATERIAL

(75) Inventors: Ronald O. Miles, Menlo Park, CA (US); Ludwig L. Galambos, Menlo Park, CA (US); Janos J. Lazar, Redwood City, CA (US); Gabriel C. Risk, Burlingame, CA (US); Alexei L. Alexandrovski, Los Gatos, CA (US); Gregory D. Miller, Foster City, CA (US); David Caudillo, Saratoga, CA (US); Joseph M. McRae, San Jose, CA (US); Gisele L. Foulon, Cupertino, CA (US)

(73) Assignee: Silicon Light Machines Corporation, Sunnyvale, CA (US)

( * ) Notice: Subject to any disclaimer, the term of this patent is extended or adjusted under 35 U.S.C. 154(b) by 603 days.

(21) Appl. No.: 10/187,330

(22) Filed: Jun. 28, 2002

(65) Prior Publication Data
US 2004/0163596 A1 Aug. 26, 2004

(51) Int. Cl.$^7$ .......................... C01G 35/00; C01D 15/00
(52) U.S. Cl. .................................... 423/594.8
(58) Field of Search ...................... 423/594.8; 252/584; 117/3

(56) References Cited

U.S. PATENT DOCUMENTS 6,319,430 B1    11/2001    Bordui et al.

FOREIGN PATENT DOCUMENTS

| ES | 2170028 | * | 7/2002 |
| JP | 408075941 A | | 3/1996 |
| WO | WO 2004/030046 A1 | | 4/2004 |
| WO | WO 2004030047 A1 | | 4/2004 |

OTHER PUBLICATIONS

International Search Report for PCT/US03/17015 mailed Aug. 18, 2002; total of 2 sheets.

P.F. Bordui, et al. "Chemically–Reduced Lithium Niobate Single Crystals: Processing, Properties and Improved SAW Device Fabrication and Performance"; pp. 1–17; Cyrstal Technology, Inc. Palo Alto, CA; Anderson Laboratories, Bloomfield, CT., USA.

* cited by examiner

*Primary Examiner*—Steven Bos
(74) *Attorney, Agent, or Firm*—Okamoto & Benedicto LLP

(57) ABSTRACT

In one embodiment, a ferroelectric material is processed by placing the material in an environment including metal vapor and heating the material to a temperature below the Curie temperature of the material. This allows the bulk conductivity of the ferroelectric material to be increased without substantially degrading its ferroelectric domain properties. In one embodiment, the ferroelectric material comprises lithium tantalate and the metal vapor comprises zinc.

12 Claims, 3 Drawing Sheets

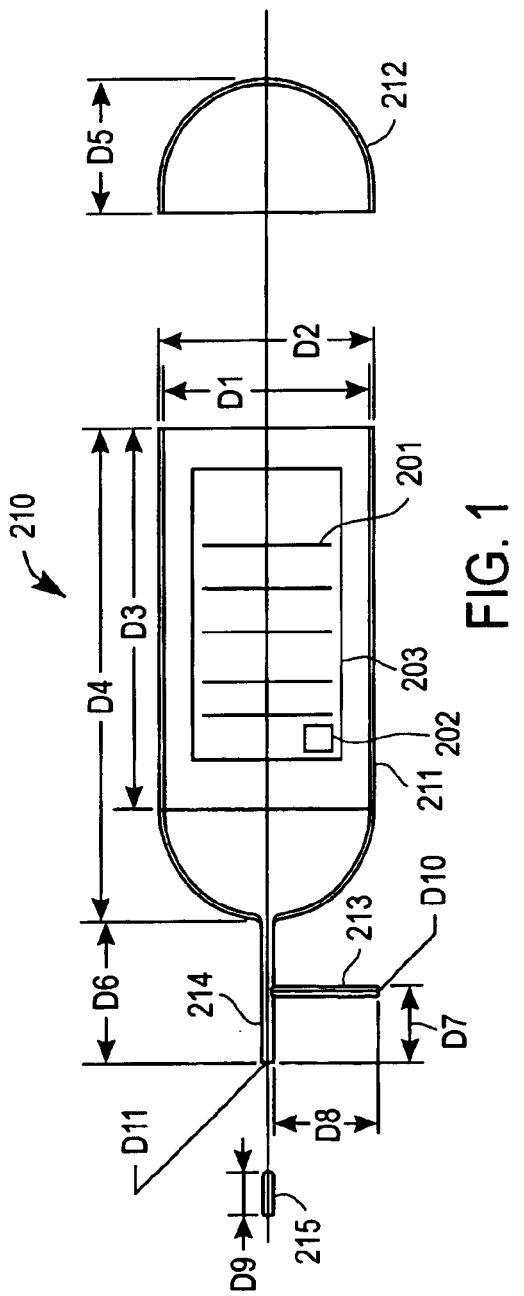
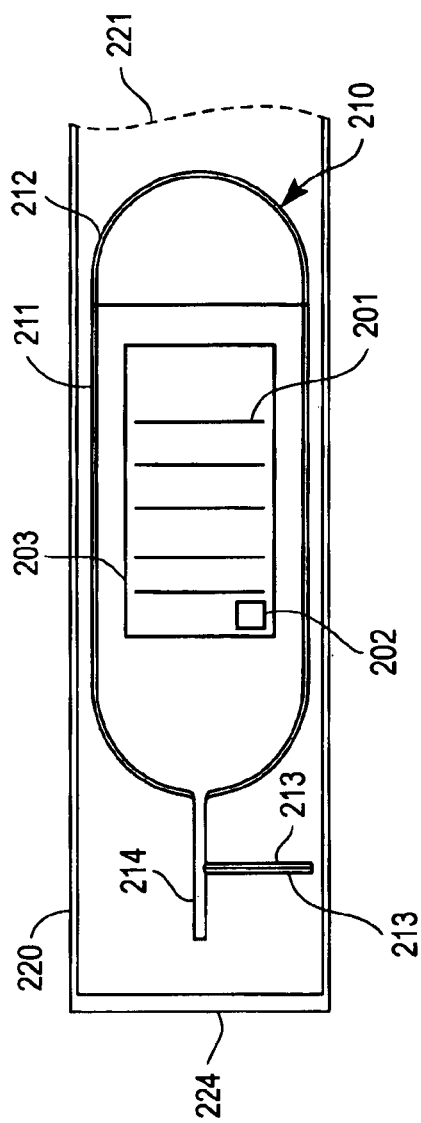
FIG. 1
FIG. 2

METHOD AND APPARATUS FOR INCREASING BULK CONDUCTIVITY OF A FERROELECTRIC MATERIAL

BACKGROUND OF THE INVENTION

1. Field of the Invention

The present invention relates generally to material processing, and more particularly, but not exclusively, to methods and apparatus for processing a ferroelectric material.

2. Description of the Background Art

Lithium tantalate ($LiTaO_3$) and lithium niobate ($LiNbO_3$) are widely used materials for fabricating nonlinear optical devices because of their relatively large electro-optic and nonlinear optical coefficients. These nonlinear optical devices include wavelength converters, amplifiers, tunable sources, dispersion compensators, and optical gated mixers, for example. Lithium tantalate and lithium niobate are also known as ferroelectric materials because their crystals exhibit spontaneous electric polarization.

Because lithium tantalate and lithium niobate materials have relatively low bulk conductivity, electric charge tends to build up in these materials. Charge may build up when the materials are heated or mechanically stressed. Because the charge may short and thereby cause a device to fail or become unreliable, device manufacturers have to take special (and typically costly) precautions to minimize charge build up or to dissipate the charge.

The bulk conductivity of a lithium niobate material may be increased by heating the lithium niobate material in an environment including a reducing gas. The reducing gas causes oxygen ions to escape from the surface of the lithium niobate material. The lithium niobate material is thus left with excess electrons, resulting in an increase in its bulk conductivity. The increased bulk conductivity prevents charge build up.

Although the just described technique may increase the bulk conductivity of a lithium niobate material under certain conditions, the technique is not particularly effective with lithium tantalate. A technique for increasing the bulk conductivity of a lithium tantalate material is desirable because lithium tantalate is more suitable than lithium niobate for some high-frequency surface acoustic wave (SAW) filter applications, for example.

SUMMARY

In one embodiment, a ferroelectric material is processed by placing the material in an environment including metal vapor and heating the material to a temperature below the Curie temperature of the material. This allows the bulk conductivity of the ferroelectric material to be increased without substantially degrading its ferroelectric domain properties. In one embodiment, the ferroelectric material comprises lithium tantalate and the metal vapor comprises zinc.

These and other features of the present invention will be readily apparent to persons of ordinary skill in the art upon reading the entirety of this disclosure, which includes the accompanying drawings and claims.

DESCRIPTION OF THE DRAWINGS

FIG. 1 shows a schematic diagram of a container in accordance with an embodiment of the present invention.

FIG. 2 shows a schematic diagram of a housing in accordance with an embodiment of the present invention.

Figure 3:
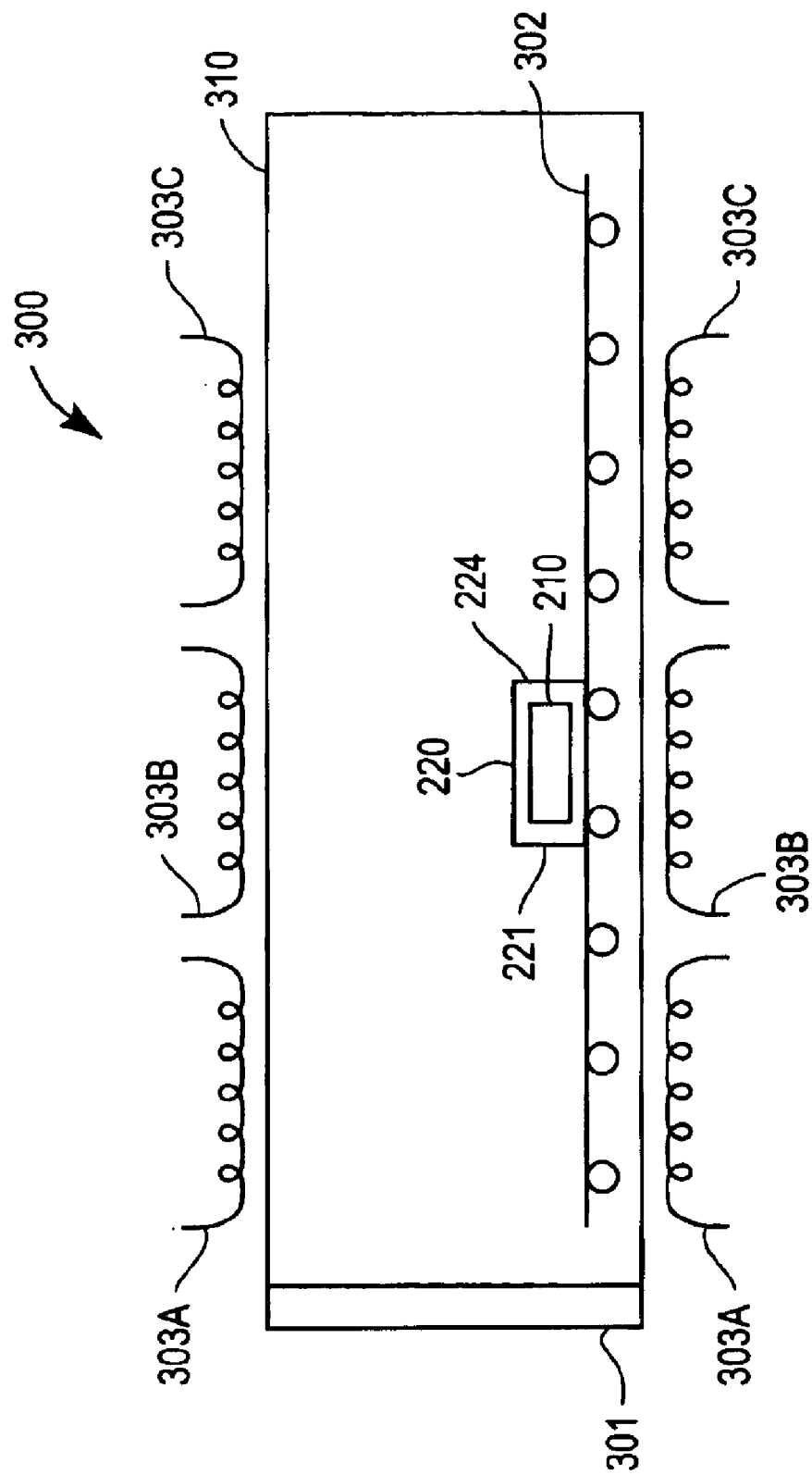
FIG. 3 shows a system for increasing the bulk conductivity of a ferroelectric material in accordance with an embodiment of the present invention.

The use of the same reference label in different drawings indicates the same or like components. Drawings are not necessarily to scale unless otherwise noted.

DETAILED DESCRIPTION

In the present disclosure, numerous specific details are provided such as examples of apparatus, process parameters, process steps, and materials to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Moreover, it should be understood that although embodiments of the present invention will be described in the context of lithium tantalate, the present invention is not so limited. Those of ordinary skill in the art can adapt the teachings of the present invention to increase the bulk conductivity of other ferroelectric materials such as lithium niobate, for example.

In accordance with an embodiment of the present invention, the bulk conductivity of a ferroelectric material may be increased by placing the material in an environment including metal vapor and heating the material to a temperature up to the Curie temperature of the material. Generally speaking, the Curie temperature of a ferroelectric material is the temperature above which the material loses its ferroelectric properties. By heating a single domain ferroelectric material to a temperature below its Curie temperature in the presence of a metal vapor with relatively high diffusivity, the ferroelectric domain state of the ferroelectric material is not appreciably degraded.

Preferably, the metal to be converted to vapor has relatively high diffusivity and has the potential to reduce the oxidation state of the ferroelectric material. The inventors believe that these properties will allow ions of the metal to diffuse a few microns into the surface of the ferroelectric material to fill lattice site vacancies, reducing the state of oxidation and thereby liberating electrons from the ferroelectric material and beginning a process of filling negative ion site vacancies throughout the bulk of the material. The electrons that fill these negative ion site vacancies are believed to be bound to point defect sites. These bound electrons, in general, will have a spectrum of energy levels that leave the ferroelectric material with a distinctive broad coloration. With the filling of lattice site vacancies and supplying neutralizing electrons to point defect sites, excess charge can be rapidly neutralized or conducted away perhaps as a polaron. When excess charge (electron) is introduced into the lattice, it is energetically favorable for the electron to move as an entity within the polarization of the lattice. Such an entity, referred to as a "polaron", results in increased electron mobility. Since the electron charge is screened by the lattice, polarons may move unobstructed by electrostatic forces along the lattice.

In one embodiment, the metal to be converted to vapor comprises zinc and the ferroelectric material comprises lithium tantalate in wafer form. Zinc vapor may be created by heating zinc to a temperature slightly below the Curie temperature of the lithium tantalate wafer. To obtain a vapor pressure that is high enough for efficient diffusion at a temperature below the Curie temperature, the metal and lithium tantalate wafer may be heated in a sealed container that has a predetermined volume. The inventors believe that heating a lithium tantalate wafer in zinc vapor causes zinc to diffuse into the surface of the lithium tantalate wafer and fill lithium site vacancies. It is believed that this results in the release of extra electrons according to equation 1:

$$Zn+VLi^-=Zn^{+2}Li+2e^- \qquad \text{EQ. 1}$$

It is believed that the extra electrons are trapped in negative ion site vacancies in the bulk of the lithium tantalate wafer. Increased electron mobility in the bulk of the lithium tantalate wafer results when excess charge build up due to pyroelectric or piezoelectric effects are conducted away as polarons. That is, the inventors believe that the increased conductivity of the lithium tantalate wafer appears to be polaron in nature.

Referring now to FIG. 1, there is shown a schematic diagram of a container 210 in accordance with an embodiment of the present invention. Container 210 may be used to hold one or more wafers 201 to be processed and a metal 202 to be converted to vapor. Container 210 includes a body 211 and an end-cap 212. End-cap 212 may be welded onto body 211 using an oxygen-hydrogen torch, for example.

Body 211 includes a tube section 213 and a tube section 214. Container 210 may be sealed by capping tube sections 213 and 214, and welding end-cap 212 onto body 211. Tube section 214 may be capped by inserting a plug 215 into tube section 214 and welding the wall of plug 215 to that of tube section 214. Tube section 213 may be a sealed capillary tube. A vacuum pump may be coupled to tube section 214 to evacuate container 210. A sealed tube section 213 may be cracked open at the end of a process run to increase the pressure in container 210 (e.g., to bring the pressure in container 210 to atmospheric pressure).

Still referring to FIG. 1, one or more wafers 201 may be placed in a wafer cage 203, which may then be inserted into container 210. A metal 202 may be placed inside wafer cage 203 along with wafers 201. Wafer cage 203 may be a commercially available wafer cage such as of those available from LP Glass, Inc. of Santa Clara, Calif. Wafer cage 203 may be made of quartz, for example.

Table 1 shows the dimensions of a container 210 in one embodiment. It is to be noted that container 210 may be scaled to accommodate a different number of wafers.

TABLE 1

(REFER TO FIG. 1)

| Dimension | Value (mm) | |
|---|---|---|
| D1 | Inside Diameter | 120.00 |
| D2 | Outside Diameter | 125.00 |
| D3 | | 217.00 |
| D4 | | 279.24 |
| D5 | | 76.20 |
| D6 | | 80.00 |
| D7 | | 40.00 |
| D8 | | 60.00 |
| D9 | | 25.40 |

TABLE 1-continued (REFER TO FIG. 1)

| Dimension | Value (mm) | |
|---|---|---|
| D10 | Inside Diameter | 4.00 |
| | Outside Diameter | 6.00 |
| D11 | Inside Diameter | 7.00 |
| | Outside Diameter | 9.00 |

FIG. 2 shows a schematic diagram of a housing 220 in accordance with an embodiment of the present invention. Housing 220 may be a cylindrical container made of alumina. Container 210 may be inserted in housing 220, as shown in FIG. 2, and then heated in a process tube, as shown in FIG. 3. Housing 220 surrounds container 210 to allow for uniform heating of container 210. Additionally, housing 220 serves as a physical barrier to protect container 210 from breaking.

As shown in FIG. 2, housing 220 may have a closed-end 224 and an open-end 221. Container 210 is preferably placed inside housing 220 such that end-cap 212 is towards open-end 221. Open-end 221 allows for convenient removal of container 210 from housing 220. Open-end 221 also facilitates creation of a thermal gradient in container 210 during a temperature ramp down. The thermal gradient results in a cold spot in end-cap 212 that attracts precipitating metal vapor away from the wafers inside container 210. This minimizes the amount of precipitates that have to be removed from the surface of the wafers. This aspect of the present invention will be further described below.

FIG. 3 shows a system 300 for increasing the bulk conductivity of a ferroelectric material in accordance with an embodiment of the present invention. System 300 includes a process tube 310 containing housing 220. As mentioned, housing 220 houses container 210, which in turn holds metal 202 and wafers 201. Process tube 310 may be a commercially available furnace generally used in the semiconductor industry. Process tube 310 includes heaters 303 (i.e., 303A, 303B, 303C) for heating housing 220 and all components in it. Process tube 310 may be 72 inches long, and divided into three 24-inch heating zones with the middle heating zone being the "hot zone". Process tube 310 may include a first heating zone heated by a heater 303A, a second heating zone heated by a heater 303B, and a third heating zone heated by a heater 303C. Process tube 310 also includes a cantilever 302 for moving housing 220, and a door 301 through which housing 220 enters and leaves the process tube. Housing 220 may be placed in the middle of process tube 310 with open-end 221 facing door 301.

Figure 4:
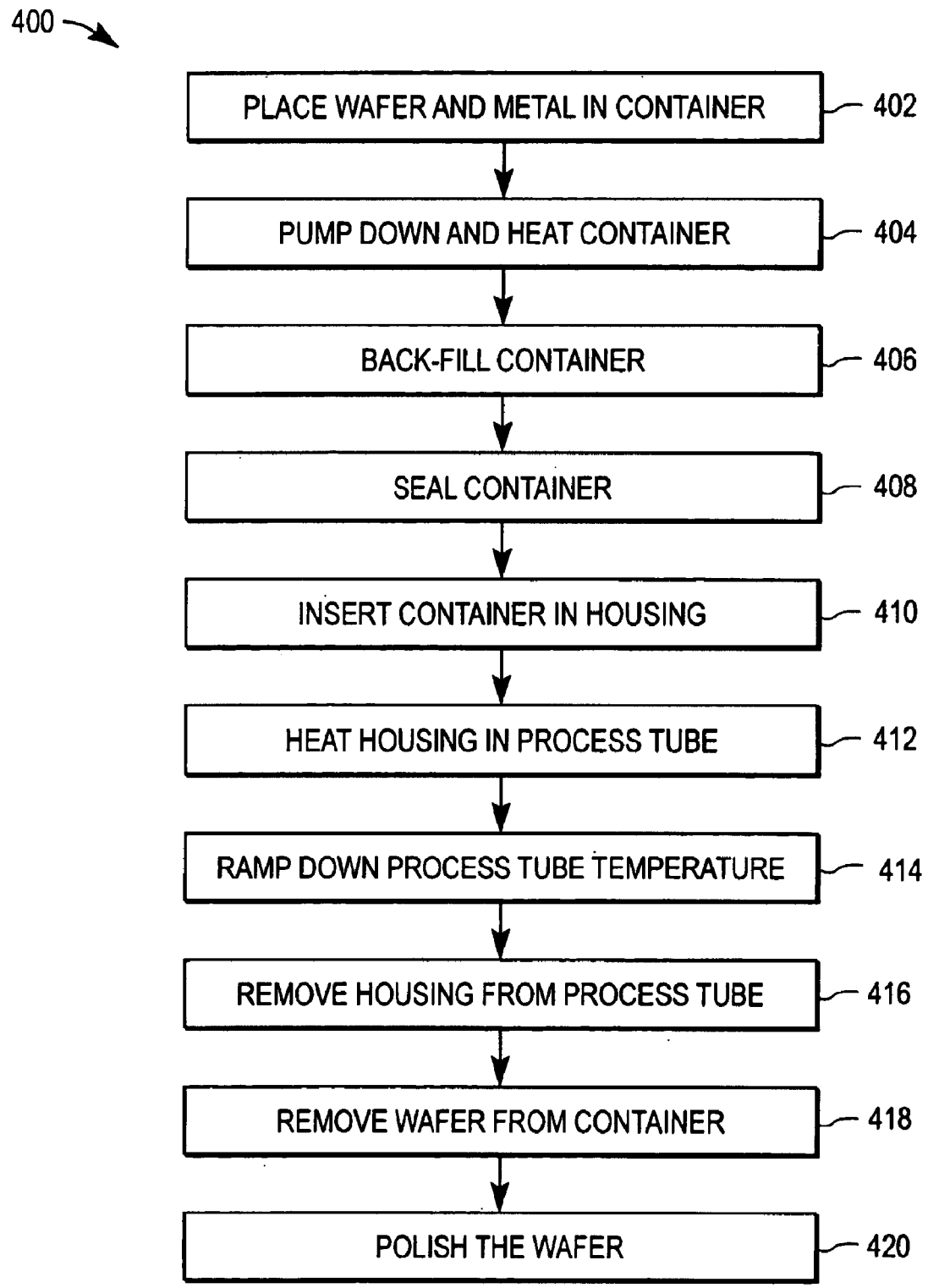
FIG. 4 shows a flow diagram of a method of increasing the bulk conductivity of a ferroelectric material in accordance with an embodiment of the present invention.

FIG. 4 shows a flow diagram of a method 400 for processing a ferroelectric material in accordance with an embodiment of the present invention. Method 400 will be described using container 210, housing 220, and system 300 as an example. It should be understood, however, that flow diagram 400, container 210, housing 220, and system 300 are provided herein for illustration purposes and are not limiting.

In step 402 of FIG. 4, metal 202 and one or more wafers 201 are placed in wafer cage 203. Wafer cage 203 is then placed inside container 210. In one embodiment, wafers 201 are 42 degree rotated-Y lithium tantalate wafers that are 100 mm in diameter, while metal 202 comprises zinc that is 99.999% pure. In one embodiment, five wafers 201 are placed in wafer cage 203 along with about 8 grams of zinc. The zinc may be in pellet form. Zinc pellets that are 99.999% pure are commercially available from Johnson Matthey, Inc. of Wayne, Pa. Note that the amount of zinc per wafer may be varied to suit specific applications.

In step 404, container 210 is pumped down to about $10^{-7}$ Torr and then heated to about 200° C. for about five hours. Step 404 may be performed by welding end-cap 212 onto body 211, capping tube section 213, coupling a vacuum pump to tube section 214, and heating container 210 with a heating tape wrapped around container 210. Step 404 helps remove oxygen sources, water, and other contaminants out of container 210 before metal 202 is melted.

In step 406, container 210 is back-filled so that the pressure in container 210 at slightly below Curie temperature is approximately 760 Torr. In one embodiment, container 210 is back-filled to about 190 Torr. This increases the pressure inside container 210, thus making it safer to heat container 210 to elevated temperatures for long periods of time. Container 210 may be back-filled with an inert gas such as Argon. Optionally, container 210 may be back-filled with forming gas comprising 95% nitrogen and 5% hydrogen. Note that the forming gas alone is not sufficient to reduce a lithium tantalate material so that its bulk conductivity is increased. However, in the present example, forming gas helps in trapping oxygen that may have remained in container 210 after step 404. Back-filling container 210 with forming gas may not be needed in applications where container 210 has been completely purged of contaminants. Container 210 may be back-filled by welding plug 215 to tube section 214, breaking the cap off tube section 213, and then flowing back-fill gas through tube section 213.

In step 408, container 210 is sealed. At this point, container 210 may be sealed by removing the source of the back-fill gas and capping tube section 213. (Note that end-cap 212 has already been welded onto body 211 and tube section 214 has already been capped in previous steps.)

In step 410, container 210 is inserted in housing 220.

In step 412, housing 220 is heated in process tube 310 at a temperature below the Curie temperature of wafers 201. Heating housing 220 at a temperature below the Curie temperature of wafers 201 melts metal 202 without substantially degrading the ferroelectric properties of wafers 201. Melting metal 202 results in metal vapor surrounding wafers 201. In this example, the metal vapor comprises zinc vapor and wafers 201 are of lithium tantalate. The interaction between zinc vapor and lithium tantalate that the inventors believe causes the bulk conductivity of wafers 201 to increase has been previously described above.

In one embodiment, housing 220 is heated in the middle of a process tube 310 that is 72 cm long. Also, as shown in FIG. 3, housing 220 may be placed in process tube 310 such that open-end 221 is facing door 301. Container 210 is preferably placed inside housing 220 such that end-cap 212 is towards open-end 221 (see FIG. 2).

In one embodiment, housing 220 is heated in process tube 310 at a ramp up rate of about 150° C./hour to a maximum temperature of about 595° C., for about 240 hours. Preferably, housing 220 is heated to a maximum temperature just a few degrees below the Curie temperature of wafers 201. Because the Curie temperature of wafers may vary depending on their manufacturer, the maximum heating temperature may have to be adjusted for specific wafers. The heating time of housing 220 in process tube 310 may also be adjusted to ensure adequate indiffusion of the metal vapor. Note that because method 400 is performed on bare wafers 201 (i.e., before devices are fabricated on wafers 201), the total process time of method 400 does not appreciably add to the amount of time needed to fabricate a device.

Continuing in step 414, the temperature inside process tube 310 is ramped down to prevent the just processed wafers 201 from being degraded by thermal shock. In one embodiment, the temperature inside process tube 310 is ramped down by setting its temperature set point to 400° C. Thereafter, cantilever 302 (see FIG. 3) may be programmed to move housing 220 towards door 301 at a rate of about 2 cm/minute for 3 minutes, with a 1.5 (one and a half) minute pause time between movements. That is, housing 220 may move at a rate of 3 cm/minute for 3 minutes, then pause for 1.5 minutes, then move at a rate of 3 cm/minute for 3 minutes, then pause for 1.5 minutes, and so on for a total of 40 minutes until housing 220 reaches door 301.

As housing 220 is moved towards door 301, open-end 221 of housing 220 becomes cooler than closed-end 224. This results in a thermal gradient inside container 210, with end-cap 212 (which along with open-end 221 is facing door 301) becoming colder than the rest of container 210. The creation of a thermal gradient in container 210 may also be facilitated by adjusting the heaters of process tube 310 such that the temperature is lower towards door 301. The thermal gradient inside container 210 results in end-cap 212 becoming a cold spot that attracts precipitating metal vapor away from wafers 201.

In step 416, housing 220 is removed from process tube 310. Container 210 is then removed from housing 220.

In step 418, wafers 201 are removed from container 210. Step 418 may be performed by first cracking open tube section 213 (see FIG. 1) to slowly expose container 210 to atmosphere. Container 210 may also be back-filled with an inert gas. Thereafter, end-cap 212 may be cut away from body 211 using a diamond-blade saw, for example.

In step 420, wafers 201 are polished to remove precipitates from their surface and to expose their bulk. In one embodiment, both sides of a wafer 201 are polished by chemical-mechanical polishing to remove about 50 microns from each side.

In an experiment, five 42 degree rotated-Y lithium tantalate wafers that are 100 mm in diameter, hereinafter referred to as "experimental wafers", were processed in accordance with the just described method 400. The experimental wafers were placed in a container 210 along with 8 grams of zinc, and then heated in a process tube 310 to 595° C. for 240 hours. Thereafter, the temperature of the process tube 310 was ramped down and the experimental wafers were removed from the container 210. The experimental wafers were then polished on both sides and visually inspected. The experimental wafers looked homogenous and grayish in color. The bulk conductivity of the experimental wafers was then tested by placing them one at a time on a hot plate, raising the temperature of the hot plate from 80° C. to 120° C. at a rate of 3° C./min, and measuring the resulting electric field near the surface of the wafers. The electric field was measured using an electrometer from Keithley Instruments of Cleveland, Ohio under the model name Model 617. The experimental wafers did not produce any measurable electric field near their surface, indicating that their bulk conductivity has increased.

For comparison purposes, an unprocessed 42 degree rotated-Y lithium tantalate wafer that is 100 mm in diameter, referred to herein as a "control wafer", was placed on a hot plate. The temperature of the hot plate was then increased from 80° C. to 120° C. at a rate of 3° C./min. Measuring the electric field near the surface of the control wafer indicated a 400V increase for every 20° C. change in temperature. This indicates that the bulk conductivity of the control wafer is relatively low.

While specific embodiments of the present invention have been provided, it is to be understood that these embodiments are for illustration purposes and not limiting. Many additional embodiments will be apparent to persons of ordinary skill in the art reading this disclosure. Thus, the present invention is limited only by the following claims.

What is claimed is:

1. A method of processing lithium tantalate, the method comprising:
   placing the lithium tantalate in an environment including zinc vapor; and
   heating the lithium tantalate to a temperature below a Curie temperature of the lithium tantalate.

2. The method of claim 1 wherein the temperature is less than or equal to about 595° C.

3. The method of claim 1 further comprising:
   after heating the lithium tantalate, creating a thermal gradient such that the zinc vapor precipitates at a location away from the lithium tantalate.

4. The method of claim 1 wherein the lithium tantalate is heated inside a sealed container with the zinc vapor.

5. The method of claim 4 wherein the sealed container contains an inert gas.

6. The method of claim 5 wherein the inert gas comprises argon.

7. The method of claim 4 wherein the sealed container contains a forming gas.

8. The method of claim 4 wherein the sealed container is heated in a process tube.

9. The method of claim 4 further comprising:
   after heating the lithium tantalate, cooling the sealed container such that a first end of the sealed container is cooler than a second end of the sealed container to facilitate precipitation of the zinc vapor near the first end.

10. A method of processing a lithium tantalate material, the method comprising:
    heating a lithium tantalate material at a temperature below the Curie temperature of the lithium tantalate material and in an environment including zinc vapor.

11. The method of claim 10 wherein the lithium tantalate material is heated inside a sealed container.

12. The method of claim 10 wherein the environment includes a forming gas.

* * * * *